United States Patent

Xu et al.

(10) Patent No.: US 9,601,653 B2
(45) Date of Patent: Mar. 21, 2017

(54) NA DOSING CONTROL METHOD

(71) Applicant: TSMC SOLAR LTD., Taichung (TW)

(72) Inventors: Li Xu, Taichung (TW); Wen-Chin Lee, Baoshan Township (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 14/303,624

(22) Filed: Jun. 13, 2014

(65) Prior Publication Data

US 2015/0364637 A1  Dec. 17, 2015

(51) Int. Cl.
*H01L 21/02* (2006.01)
*H01L 31/18* (2006.01)
*H01L 31/032* (2006.01)

(52) U.S. Cl.
CPC .... *H01L 31/1864* (2013.01); *H01L 21/02299* (2013.01); *H01L 21/02387* (2013.01); *H01L 31/0323* (2013.01); *H01L 31/1892* (2013.01); Y02E 10/50 (2013.01); Y02P 70/521 (2015.11)

(58) Field of Classification Search
CPC ........... H01L 21/0201; H01L 21/02296; H01L 21/02301; H01L 21/0231; H01L 21/02345; H01L 21/02367; H01L 21/02387; H01L 21/02656; H01L 21/64; H01L 21/70; H01L 21/702; H01L 21/71
See application file for complete search history.

(56) References Cited

U.S. PATENT DOCUMENTS

| 2001/0002668 A1* | 6/2001 | Gat | H01L 21/67115 219/390 |
| 2007/0108063 A1* | 5/2007 | Nakada | C23C 16/4481 205/510 |
| 2008/0268137 A1* | 10/2008 | Ikeda | C23C 14/12 427/70 |
| 2015/0075614 A1 | 3/2015 | Zhang et al. | |

FOREIGN PATENT DOCUMENTS

| CN | 103474505 A | 12/2013 |
| TW | 201222622 A | 6/2012 |
| TW | 201405856 A | 2/2014 |

OTHER PUBLICATIONS

Official Action issued May 11, 2016 in counterpart Taiwan Patent Application.

* cited by examiner

*Primary Examiner* — Cheung Lee
(74) *Attorney, Agent, or Firm* — Duane Morris LLP

(57) ABSTRACT

A method includes placing at least two substrates on a substrate carrier at a distance from one another, placing the substrate carrier in a reaction chamber, depositing a precursor on the at least two substrates, and performing a first annealing process on the at least two substrates. The at least two substrates include a first content of a first material. The distance between the at least two substrates is based on the first content of the first material and at least one processing parameter. The disclosed method advantageously provides for improved Na-dosing control.

20 Claims, 3 Drawing Sheets

NA DOSING CONTROL METHOD

BACKGROUND

Solar cells are electrical devices that convert light energy directly to electricity by the photovoltaic effect. The cells are gaining increasing popularity as energy source as their efficiency improves and the world looks for energy sources that do not generate greenhouse gasses. Some solar cells include a copper indium gallium selenide ("CIGS") semiconductor material that is used in thin-film solar cells. While sodium doping has been found to improve the performance of CIGS solar cells, there is currently limited control of the Na dosing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
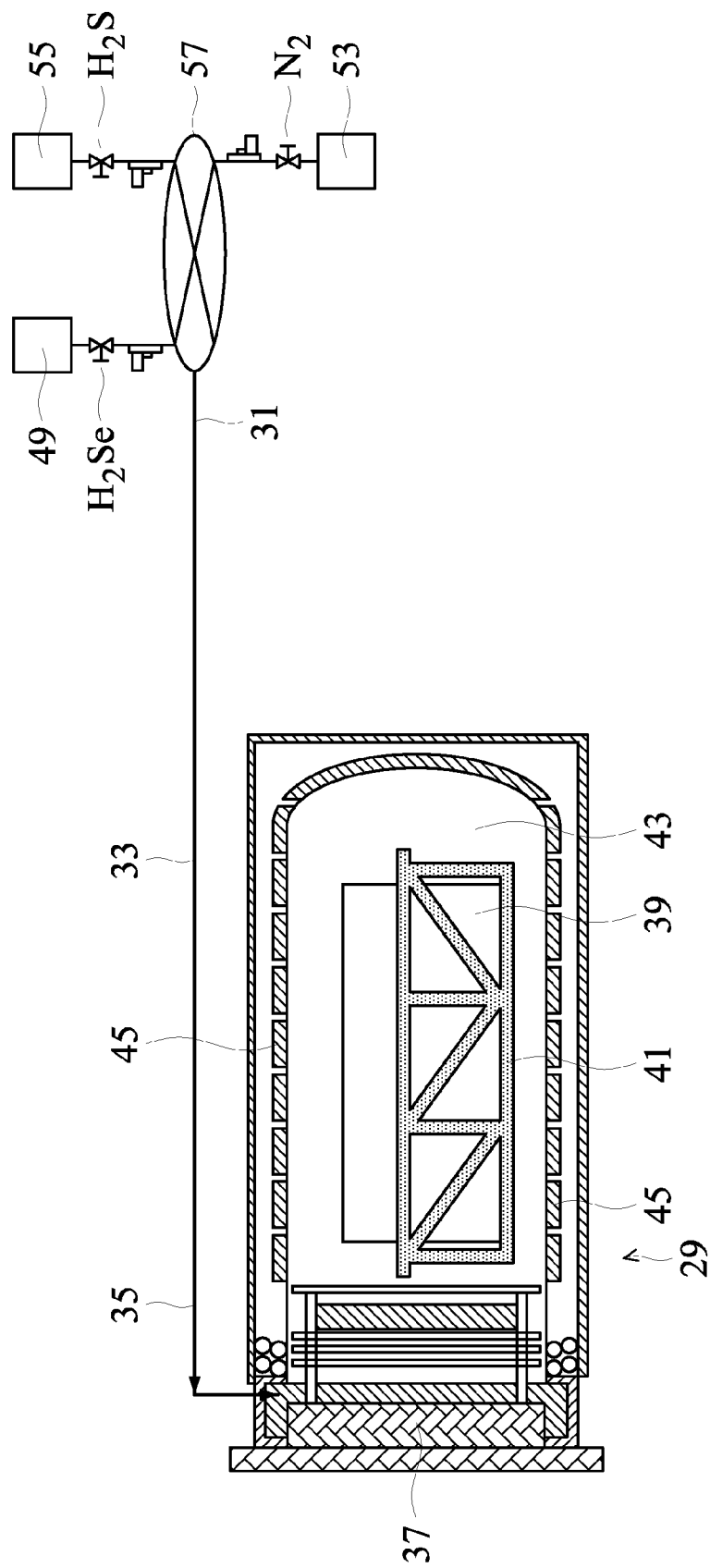
FIG. 1 is a cross-sectional view of a furnace system for forming semiconductor absorber materials in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosed systems and method advantageously improve the ability to control sodium (Na) dosing of a substrate. It is believed that the Na from the glass substrate formed from a Na—Se compound and re-deposited on top of CIG(s) film participates in the annealing reaction. Proper dosing, i.e., dosing the right amount, of Na—Se into CIG(s) is beneficial because proper dosing of Na improves the device performance of a solar cell. Large amounts of Na can be detrimental to device performance, so Na-dosing control is desirable and previously was not achievable. In some embodiments, the Na-dosing control is achieved through providing particular spacing distances and well as the processing parameters including, but not limited to, temperature, $H_2Se$ concentration, $Na_2O$ concentration, and $K_2O$ content.

Figure 2:
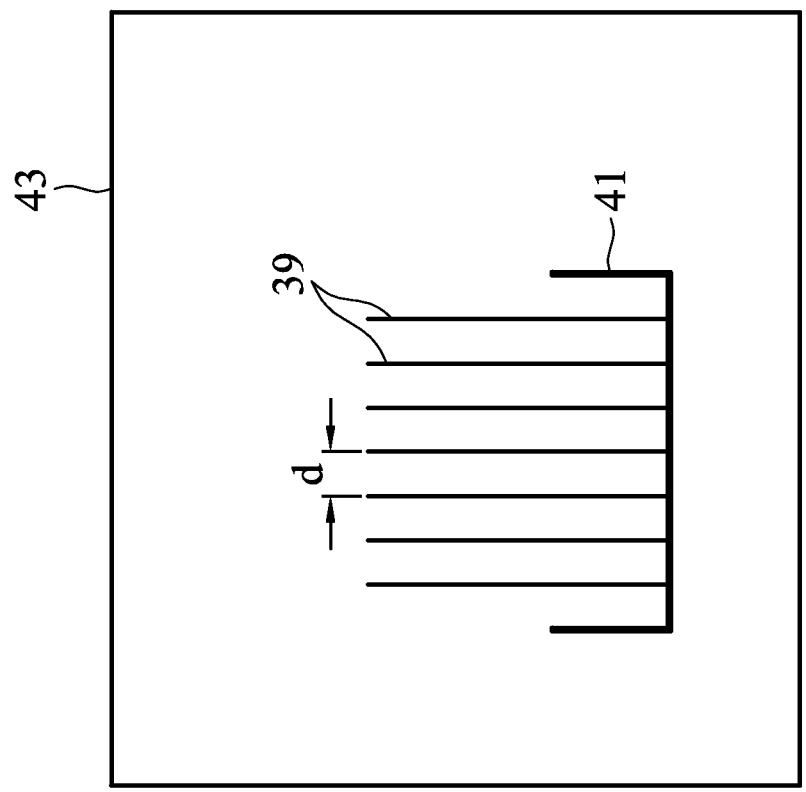
FIG. 2 is a detailed view of a plurality of substrates disposed on a carrier at a spacing distance from one another and positioned within a reaction chamber in accordance with some embodiments.

FIG. 1 shows a reaction furnace 29 within which a chalcogenide semiconductor absorbent material is formed on a substrate. FIG. 2 shows a gas line 33 through which streams of inlet reaction gas 31 and gas mixture 35 flow. In some process steps of various embodiments, one or more inlet reaction gases 31 produce gas mixture 35 which is delivered to furnace 29. Gas mixture 35 is delivered to reaction furnace 29. Reaction furnace 29 is a programmable furnace capable of carrying out multiple in-situ processing operations in sequence and according to one embodiment, reaction furnace 29 carries out one or more chalcogenide semiconductor absorber material formation operations such as a selenization operation and a sulfurization operation. In some embodiments, the chalcogenide semiconductor absorber material formation operation includes a selenization reaction followed by a sulfurization reaction and in some embodiments, an annealing operation is carried out after either or both of the selenization and sulfurization steps. As such, various inlet reaction gases 31 are used. Inlet reaction gas 31 is delivered as part or all of gas mixture 35 to reaction furnace 29. In some embodiments, depending on the particular furnace operation being carried out in reaction furnace 29.

Reaction furnace 29 includes door 37 for loading and unloading substrates such as substrate 39. Substrate 39 is retained by quartz boat 41 within reaction chamber 43. Heater shield 45 included a heating element and is used to heat reaction furnace 29 to various temperatures. Substrate 39 is a solar cell substrate in some embodiments. Substrate 39 is formed of glass, or suitable organic material such as polyimide, or metal foil in various embodiments. In other embodiments, quartz boat 41 is replaced by another suitable member for retaining substrate 39 within reaction chamber 43.

According to the methods of the disclosure, substrate 39 includes a metallic precursor material on its surface and a reaction takes place between at least inlet reaction gas 31 and the metal precursors on the surface of substrate 39, within reaction chamber 43 of reaction furnace 29. The disclosure provides for causing the reaction by heating reaction furnace 29 including substrate 39. In some embodiments, the metal precursor on substrate 39 includes Cu, In, Ga, but other materials, including Se and Na, are used in other embodiments. In some embodiments, the reaction is a sulfurization operation using an S-containing reactive gas as inlet reaction gas 31 and in another embodiment, the reaction is a selenization operation using an Se-containing reactive gas as inlet reaction gas 31 but still other reactions and methods are performed in other embodiments. According to the embodiment in which the metal precursor on substrate 39 includes Cu, In, Ga, in the selenization operation, the precursor is converted to Cu(In,Ga)Se (CIGS) via a thermal selenization operation and in some embodiments, the selenization operation is followed by a sulfurization operation in which the selenized precursor material of CIGS is converted to Cu(In,Ga)SeS (CIGSS) via a thermal process, in which the CIGS reacts with a S-containing gas.

Inlet reaction gas 31 is composed of one or several gases from various gas sources. In the illustrated embodiment, gas sources 49, 51, 53 and 55 feed gas mixer 57. In the illustrated embodiment, gas source 49 is $H_2Se$, gas source 53 is $N_2$ and gas source 55 is $H_2S$. Other gas sources are used in other embodiments. In one embodiment, $N_2$ gas source 53 and reactant $H_2S$ gas source 55 are combined in gas mixer 57 and delivered as inlet reaction gas 31 to reaction chamber 43 for a sulfurization reaction. For both the selenization operation and the sulfurization operation, different sources of selenium and sulfur are used in other embodiments and carrier gases other than argon and nitrogen are also used in other embodiments. In some embodiments, Ar gas source 51 or $N_2$ gas source 53 or other inert gases are delivered to reaction chamber 43 in an annealing operation.

Figure 3A:
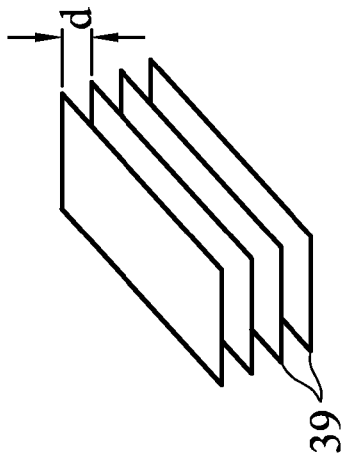
FIGS. 3A and 3B illustrate alternative arrangements of substrates in accordance with some embodiments.
Figure 3B:
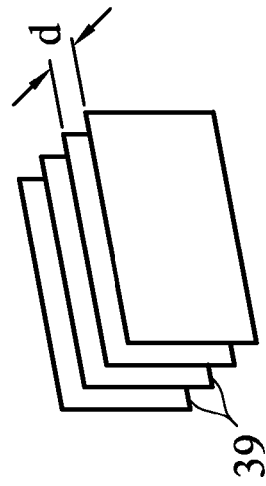

Turning now to FIG. 3, a quartz boat 41, or other substrate carrier, is shown disposed within reaction chamber 43 of reaction furnace 29. Substrate carrier 41 is shown supporting a plurality of substrates 39 at a distance, d, from one another. Substrates 39 can be positioned within substrate carrier 41 in a back-to-back arrangement (i.e., such that the glass substrates face one-another) or a front-to-front arrangement (i.e., such that absorber layers face one another). Although substrates 39 are shown being disposed such that they extend vertically within reaction chamber 43, the substrates 39 can be positioned horizontally as shown in FIG. 3A or at another angle as shown in FIG. 3B.

The inventors have discovered that the spacing distance, d, can be used to control the sodium dosing of substrates 39. For example, the inventors have discovered that for glass substrates 39 having a $K_2O$ content of at least five percent and a $Na_2O$ concentration of approximately two percent and 12 percent the spacing distance, d, can be varied between approximate five and 100 mm depending on other processing parameters. Examples of such other processing parameters include, but are not limited to, annealing temperature, annealing time, and the concentration of $H_2Se$, $Na_2O$, and $K_2O$ in the glass. In some embodiments, the spacing distance, d, between adjacent substrates 39 can be reduced for a higher annealing temperature, a longer annealing time, higher $H_2Se$ concentration, higher $Na_2O$ content, lower $K_2O$ content, and combinations thereof.

Figure 4:
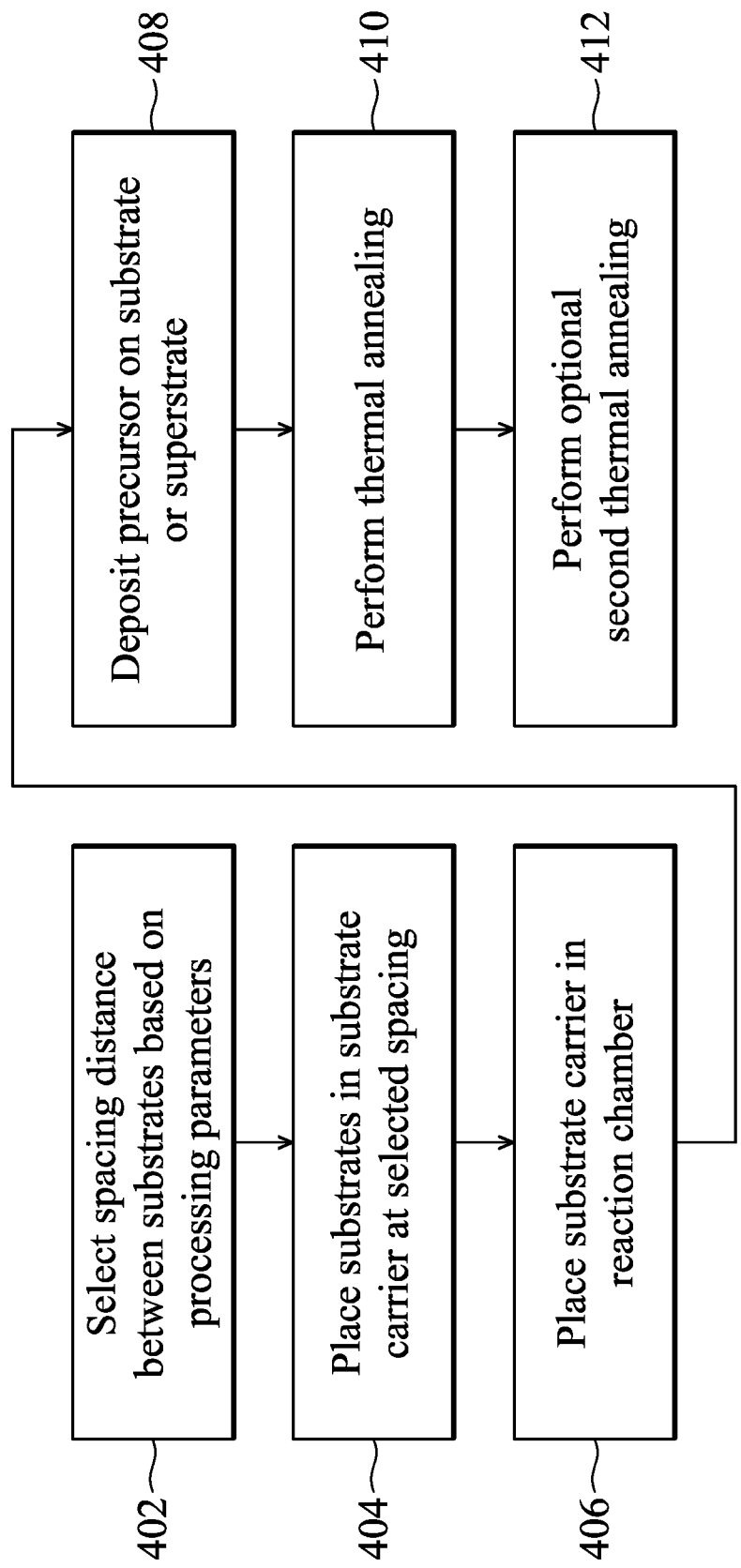
FIG. 4 is a flow diagram of one example of a method of fabricating a solar cell in accordance with some embodiments.

FIG. 4 is a flow diagram of one example of a method 400 of fabricating a solar cell in accordance with some embodiments. At block 402, the spacing distance, d, between substrates 39 is selected based on selected processing parameters. For example, the desired amount of Na dosing is determined as well as the $Na_2O$ and $K_2O$ content of the substrate and the $H_2Se$ concentration. In some embodiments, substrates 39 include between approximately two percent and 12 percent of $Na_2O$ by weight and at least approximately five percent of $K_2O$ by weight. Other processing parameters are determined/selected at block 402, including the annealing temperature and annealing time. In some embodiments, one example of processing parameters include 5% $Na_2O$, 5% $K_2O$, 4% $H_2Se$, with a 20 mm spacing in a 425° C. ambient temperature for 1 hour of annealing.

At block 404, the substrates 39 are placed in a substrate carrier 41 at the selected distance, d. In some embodiments, the substrate spacing distance, d, is between approximately five mm and approximately 100 mm. The substrates are placed in substrate carrier 41 in a back-to-back arrangement or a face-to-face arrangement in some embodiments.

At block 406, the substrate carrier 41 and substrates 39 are placed in a reaction chamber 43 of a reaction furnace 29. The substrates 39 loaded on substrate carrier 41 are placed in reaction chamber 43 through door 37. In some embodiments, the substrate carrier 41 is positioned within chamber 43 and then substrates 39 are positioned on carrier 41.

At bock 408, a precursor is deposited on a substrate 39 or superstrate, which can include glass, metal foil, and/or polymer to list only a few examples. The precursor can include the following elements Cu, In, and Ga, and optionally Se and/or Na, to list a few examples. Additionally, the precursor can be deposited using plasma vapor deposition ("PVD"), chemical vapor deposition ("CVD"), printing, or any other suitable deposition process.

At block 410, thermal annealing is performed. The substrates 39 are annealed in an ambient of $H_2Se$ at a temperature, Te, for a period of time, Ti. In some embodiments, the annealing is performed where Te<525° C. and 1 minute<Ti<60 minutes. The exact temperature and time can be adjusted within these ranges as will be understood by one of ordinary skill in the art.

In some embodiments, a second optional annealing process can be performed at block 412. This second optional annealing process can include annealing substrates 39 in an ambient of $H_2S$ and be combined with other process(es), such as a sulfuration process, to finish the solar cell modules. In some embodiments, for $H_2S$ annealing, the temperature is greater than 450° C. and the spacing is maintained to be the same as that for $H_2Se$ annealing.

The disclosed systems and methods described above advantageously improve the ability to control Na-dosing of a solar cell substrate and improves the performance of a solar cell. As described, in some embodiments, Na-dosing control is achieved through providing particular spacing distances and well as the processing parameters including, but not limited to, temperature, $H_2Se$ concentration, $Na_2O$ concentration, and $K_2O$ content.

In some embodiments, a method includes placing at least two substrates on a substrate carrier at a distance from one another, placing the substrate carrier in a reaction chamber, and performing a first annealing process on the at least two substrates. The at least two substrates include a first content of a first material. The distance between the at least two substrates is based on the first content of the first material and at least one processing parameter.

In some embodiments, the first content is between two percent and 12 percent by weight and the first material includes $Na_2O$.

In some embodiments, the first content is at least four percent by weight and the first material includes $K_2O$.

In some embodiments, the at least two substrates include a second content of a second material that is different from the first content of the first material.

In some embodiments, the first content is between two percent and 12 percent by weight and the first material includes $Na_2O$, and the second content is at least five percent by weight and the second material includes $K_2O$.

In some embodiments, the distance is between five mm and 100 mm.

In some embodiments, the at least two substrates are positioned in a back-to-back arrangement.

In some embodiments, the at least two substrates are positioned in a face-to-face arrangement.

In some embodiments, the at least one processing parameter includes one of an annealing temperature and an annealing time.

In some embodiments, the at least one processing parameter includes a concentration of $H_2Se$.

In some embodiments, a method includes performing a second annealing process after the first annealing process.

In some embodiments, a method includes placing at least two substrates on a substrate carrier at a distance from one another, placing the substrate carrier in a reaction chamber, and performing a first annealing process on the at least two substrates. The at least two substrates includes a first content of a first material and a second content of a second material. The distance between the at least two substrates is based on the first content of the first material, the second content of the second material, and at least one processing parameter.

In some embodiments, the first content is between two percent and 12 percent by weight and the first material includes $Na_2O$.

In some embodiments, the second content is at least four percent by weight and the second material includes $K_2O$.

In some embodiments, the distance is between five mm and 100 mm.

In some embodiments, the at least two substrates are positioned in a back-to-back arrangement.

In some embodiments, the at least two substrates are positioned in a face-to-face arrangement.

In some embodiments, a method includes placing at least two substrates on a substrate carrier at a distance from one another, placing the substrate carrier in a reaction chamber, and performing a first annealing process on the at least two substrates. The at least two substrates include between two percent and 12 percent by weight of $Na_2O$ and at least four percent by weight of $K_2O$, wherein the distance between the at least two substrates is based on a content of the $Na_2O$, a content of $K_2O$, and at least one processing parameter.

In some embodiments, the at least one processing parameter includes one of an annealing temperature, an annealing time, and a concentration of $H_2Se$.

In some embodiments, the distance is between five mm and 100 mm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   placing at least two substrates on a substrate carrier at a distance from one another, the at least two substrates including a first content by weight of a first material, wherein the distance between the at least two substrates is arranged in proportional to the first content by weight of the first material and at least one processing parameter;
   placing the substrate carrier in a reaction chamber; and
   performing a first annealing process on the at least two substrates.

2. The method of claim 1, wherein the first content by weight is between two percent and 12 percent by weight and the first material includes $Na_2O$.

3. The method of claim 1, wherein the first content by weight is at least four percent by weight and the first material includes $K_2O$.

4. The method of claim 1, wherein the at least two substrates include a second content by weight of a second material that is different from the first content by weight of the first material.

5. The method of claim 4, wherein the first content by weight is between two percent and 12 percent by weight and the first material includes $Na_2O$, and wherein the second content by weight is at least four percent by weight and the second material includes $K_2O$.

6. The method of claim 1, wherein the distance is between five mm and 100 mm.

7. The method of claim 6, wherein the at least two substrates are positioned in a back-to-back arrangement.

8. The method of claim 6, wherein the at least two substrates are positioned in a face-to-face arrangement.

9. The method of claim 1, wherein the at least one processing parameter includes one of an annealing temperature and an annealing time.

10. The method of claim 1, wherein the at least one processing parameter includes a concentration of $H_2Se$.

11. The method of claim 1, further comprising performing a second annealing process after the first annealing process.

12. A method, comprising:
    placing at least two substrates on a substrate carrier at a distance from one another, the at least two substrates including a first content by weight of a first material and a second content by weight of a second material, wherein the distance between the at least two substrates is arranged in proportional to the first content by weight of the first material, the second content by weight of the second material, and at least one processing parameter;
    placing the substrate carrier in a reaction chamber; and
    performing a first annealing process on the at least two substrates.

13. The method of claim 12, wherein the first content by weight is between two percent and 12 percent by weight and the first material includes $Na_2O$.

14. The method of claim 13, wherein the second content by weight is at least four percent by weight and the second material includes $K_2O$.

15. The method of claim 12, wherein the distance is between five mm and 100 mm.

16. The method of claim 15, wherein the at least two substrates are positioned in a back-to-back arrangement.

17. The method of claim 15, wherein the at least two substrates are positioned in a face-to-face arrangement.

18. A method, comprising:
    placing at least two substrates on a substrate carrier at a distance from one another, the at least two substrates including between two percent and 12 percent by weight of $Na_2O$ and at least five percent by weight of $K_2O$, wherein the distance between the at least two substrates is based on a content of the $Na_2O$, a content of $K_2O$, and at least one processing parameter;
    placing the substrate carrier in a reaction chamber; and
    performing a first annealing process on the at least two substrates.

19. The method of claim 18, wherein the at least one processing parameter includes one of an annealing temperature, an annealing time, and a concentration of $H_2Se$.

20. The method of claim 19, wherein the distance is between five mm and 100 mm.

* * * * *